United States Patent
Onodera et al.

(10) Patent No.: US 7,363,197 B2
(45) Date of Patent: Apr. 22, 2008

(54) ANALYTICAL SHELL MODEL FORMING APPARATUS

(75) Inventors: Makoto Onodera, Tsuchiura (JP); Yoshimitsu Hiro, Yokohama (JP)

(73) Assignee: Hitachi, Ltd., Tokyo (JP)

(*) Notice: Subject to any disclaimer, the term of this patent is extended or adjusted under 35 U.S.C. 154(b) by 628 days.

(21) Appl. No.: 10/901,213

(22) Filed: Jul. 29, 2004

(65) Prior Publication Data

US 2005/0073519 A1   Apr. 7, 2005

(30) Foreign Application Priority Data

Oct. 2, 2003 (JP) ............................. 2003-343905

(51) Int. Cl.
G06F 17/50 (2006.01)
G06F 19/00 (2006.01)
G06T 15/00 (2006.01)
G06T 17/00 (2006.01)

(52) U.S. Cl. ................. 703/1; 700/98; 345/419; 345/420

(58) Field of Classification Search ............ 703/1, 703/6; 700/98; 345/420, 419; 364/578, 364/512
See application file for complete search history.

(56) References Cited

U.S. PATENT DOCUMENTS 5,388,199 A * 2/1995 Kakazu et al. ............. 715/853
6,476,804 B1 * 11/2002 Costabel .................... 345/419
6,906,711 B2 * 6/2005 Hill .......................... 345/420

FOREIGN PATENT DOCUMENTS

JP   6-259505    9/1994
JP   2002-207777   7/2002

OTHER PUBLICATIONS

DJ Sheehy, CG Armstrong, DJ Robinson "Computing the Medial Surface of a Solid from a Domain Delaunay Triangulation" ACM 0-89791-672-7/95/0005, Solid Modeling 1995, pp. 201-212.*
Mohsen Rezayat, "Midsurface abstraction from 3D solid models:general theory and applications" Nov. 29, 1995, Computer-Aided Design, vol. 28, No. 11 pp. 905-915.*
Dencacademie, "PTC Product Focus: Pro/Mechanica (Structure)", PTC Email Newsletter, Jan. 14, 2002, XP007902216, Retreived from the Internet: URL: http://www.denc.de/carezone/archive/newsletters/011402.pdf, retrieved on May 3, 2007.

(Continued)

Primary Examiner—Paul Rodriguez
Assistant Examiner—Dwin McTaggart Craig
(74) Attorney, Agent, or Firm—McDermott Will & Emery LLP

(57) ABSTRACT

An analytical shell model forming apparatus includes a medial surface forming unit for approximating a solid model to a plurality of shell models. An extracting unit compares a plurality of formed medial surface models and extracts difference portions. A model candidate forming unit forms a plurality of medial surface model candidates suitable for analysis by combining the extracted difference portions. A select unit selects a medial surface model matching boundary conditions, constraint conditions and the like from the plurality of model candidates. The selected medial surface model is presented to an operator as an analysis medial surface model.

5 Claims, 9 Drawing Sheets

OTHER PUBLICATIONS

Rezayat, M., "Midsurface abstraction from 3D solid models: general theory and applications", Computer-Aided Design, Nov. 1996, pp. 905-915, vol. 28, Issue 11, Elsevier Science Ltd., Great Britain.

Armstrong, C.G., et al., "Geometric Processing for Analysis", 2000, pp. 45-56.

European Search Report Issued in corresponding European Patent Application No. EP 04 01 8001, dated May 14, 2007.

U.S. Appl. No. 10/627,607.

U.S. Appl. No. 10/630,801.

* cited by examiner

| (0. 0, 10. 0, 0. 0) | (8. 0, 20. 0, -12. 0) |
|---|---|
| BACK SIDE SURFACE OFFSET METHOD ||

} 151

| CONCAVE CONFIGURATION | 1mm |
|---|---|
| BACK SIDE SURFACE OFFSET METHOD ||

| ANALYSIS TYPE | NUMBER OF REGION DESIGNATION DATA | NUMBER OF CONFIGURATION FEATURE DESIGNATION DATA |
|---|---|---|
| START POINT OF REGION 1 | | MEDIAL SURFACE FORMING METHOD FOR REGION 1 |
| START POINT OF REGION 2 | | MEDIAL SURFACE FORMING METHOD FOR REGION 2 |
| · · · · · · | | · · · · · · |
| START POINT OF REGION n | | MEDIAL SURFACE FORMING METHOD FOR REGION n |
| TYPE OF CONFIGURATION FEATURE 1 | PARAMETER OF CONFIGURATION FEATURE 1 | MEDIAL SURFACE FORMING METHOD OF CONFIGURATION FEATURE 1 |
| TYPE OF CONFIGURATION FEATURE 2 | PARAMETER OF CONFIGURATION FEATURE 2 | MEDIAL SURFACE FORMING METHOD OF CONFIGURATION FEATURE 2 |
| · · · · · · | · · · · · · | · · · · · · |
| TYPE OF CONFIGURATION FEATURE n | PARAMETER OF CONFIGURATION FEATURE n | MEDIAL SURFACE FORMING METHOD OF CONFIGURATION FEATURE n |

FIG.7

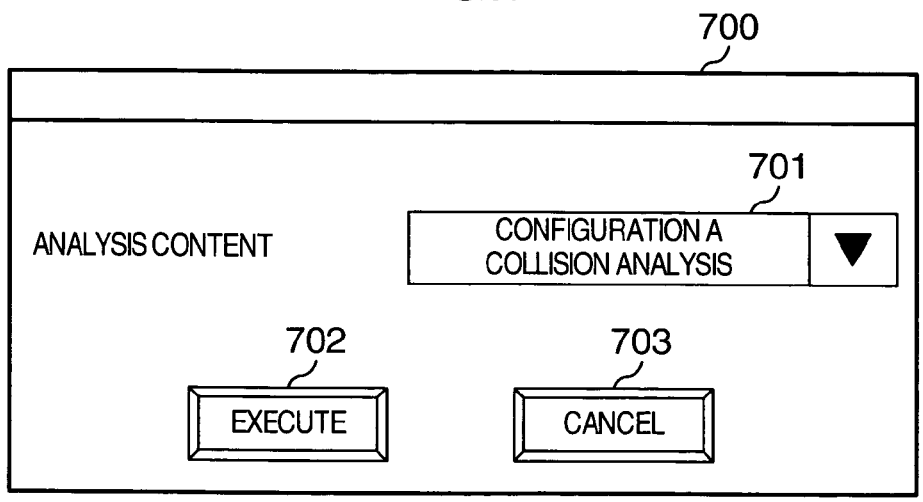

FIG.8

| | | | |
|---|---|---|---|
| CONFIGURATION A SIMPLE STRENGTH ANALYSIS | 1 | 1 | |
| (0. 0, 8. 0, 0. 0) - (10. 5, 10. 0, 5. 0) | | | MEDIAL POSITION POINT INTERPOLATION METHOD |
| CONCAVE PORTION | 1mm | | MEDIAL POSITION POINT INTERPOLATION METHOD |
| CONFIGURATION A DETAILED STRENGTH ANALYSIS | 1 | 1 | |
| (0. 0, 8. 0, 0. 0) - (10. 5, 10. 0, 5. 0) | | | MEDIAL POSITION POINT INTERPOLATION METHOD |
| CONCAVE PORTION | 0.5mm | | MEDIAL POSITION POINT INTERPOLATION METHOD |
| CONFIGURATION A COLLISION ANALYSIS | 2 | 1 | |
| (0. 0, 0. 0, 0. 0) - (13. 0, 25. 0, 30. 0) | | | FRONT SIDE SURFACE OFFSET METHOD |
| (50. 0, 0. 0, 0. 0) - (65. 0, 25. 0, 30. 0) | | | MEDIAL POSITION POINT INTERPOLATION METHOD |
| STEP | 5mm | | FRONT SIDE SURFACE OFFSET METHOD |
| CONFIGURATION B SIMPLE STRENGTH ANALYSIS | 1 | 0 | |
| (5. 0, 6. 0, -1. 0) - (15. 5, 13. 0, 2. 0) | | | BACK SIDE SURFACE OFFSET METHOD |
| CONFIGURATION B COLLISION ANALYSIS | 1 | 1 | |
| (0. 0, 8. 0, 0. 0) - (10. 5, 10. 0, 5. 0) | | | MEDIAL POSITION POINT INTERPOLATION METHOD |
| CONVEX PORTION | 1mm | | MEDIAL POSITION POINT INTERPOLATION METHOD |

ANALYTICAL SHELL MODEL FORMING APPARATUS

BACKGROUND OF THE INVENTION

The present invention relates to a numerical analysis system using a computer, and more particularly to an apparatus for forming an analytical shell model from a solid model of a thin plate structure formed by a three-dimensional configuration modeler.

An example of forming an analytical shell model from a solid model of a thin plate structure is described in JP-A-6-259505 and JP-A-2002-207777. According to an analytical model forming method described in JP-A-6-259505, even for configuration data expressed by boundary representation not having configuration features, in order to simplify a configuration with easy manipulations, a configuration model is converted into an internal data structure and geometrical features such as parallel and connection state are extracted from the configuration data. A configuration element of a portion of a simplified configuration and the type of simplification are input, a target configuration to be simplified is extracted from the geometrical features, and it is instructed to execute a configuration process to combine deletion necessary for simplification. Thereafter, the geometrical configuration of a target configuration element and a configuration element to be connected to the target configuration element is altered to delete a meaningless phase element.

According to an analytical model forming method described in JP-A-2002-207777, in order to efficiently form a neutral surface mesh model to be used for analysis in accordance with configuration data generated by a CAD system, a two-layer structure void mesh model is formed by utilizing surface information in CAD data. Each contact point of the model is moved in accordance with a motion vector set based on the configuration to gather model contact points on the neutral surface and generate the neutral surface model.

However, the analytical model forming method described in both JP-6-259505 and JP-A-2002-207777 does not consider that a medial surface model suitable for analysis is determined uniquely from a configuration model. Namely, when a configuration model having thickness is converted into a medial surface model which is a pseudo model, although it is effective that the configuration of the medial surface model is changed in accordance with the type of analysis for the configuration model such as structural analysis and collision analysis and with analysis boundary conditions, only one configuration model can be formed. Therefore, there arises the problem that it is difficult to form a medial surface model suitable for analysis.

BRIEF SUMMARY OF THE INVENTION

The present invention has been made in consideration of the above-described problem of conventional techniques and it is an object of the present invention to form a medial surface suitable for the type of analysis and boundary conditions.

It is another object of the present invention to form a medial surface suitable for analysis.

It is still another object of the present invention to improve the precision of analysis and shorten the time required for analysis by selecting a medial surface in accordance with analysis conditions.

In order to achieve the above objects of the present invention, according to an aspect of the present invention, there is provided an analytical shell model forming apparatus for forming an analytical shell model for numerical analysis from a solid model to be analyzed, comprising: medial surface forming means for forming a plurality of medial surfaces for a same potion of the solid model; extracting means for extracting a difference portion by comparing the plurality of formed medial surfaces for a same surface of the solid model; medial surface candidate model forming means for forming a plurality of medial surface candidate models by using the extracted difference portion; and selecting means for selecting a medial surface model to be used for analysis from the plurality of formed medial surface candidate models.

In this feature, the analytical shell model forming apparatus may further comprise: display means for displaying the formed medial surface candidate models on a screen; and means for registering a selected medial surface model as an analysis medial surface model. The medial surface forming means may form a plurality of medial surfaces by using at least any one of a back side surface group offset method, a front side surface group offset method and a medial position point interpolation method. The analytical shell model forming apparatus may further comprise: first selecting means for selecting a medial surface automatic forming method to be applied to each of a plurality of regions divided from the solid model; and second selecting means for selecting the medial surface automatic forming method to be applied to each parameter representative of a configuration feature, wherein the display means displays on the screen a medial surface candidate model having a medial surface formed by the methods selected by the first and second selecting means.

Furthermore, the analytical shell model forming apparatus may further comprise: registering means for registering a medial surface automatic forming method to be selected in accordance with an analysis type and to be applied to each of a plurality of regions divided from the solid model and the medial surface automatic forming method to be applied to each parameter representative of a configuration feature, in a database as medial surface forming parameters. When the analysis type registered in the medial surface forming parameter database is selected, the registering means may register the medial surface automatic forming method to be applied to each region and the medial surface automatic forming method to be applied to each parameter representative of the configuration parameter, in the database as the medial surface forming parameters.

Other objects, features and advantages of the invention will become apparent from the following description of the embodiments of the invention taken in conjunction with the accompanying drawings.

BRIEF DESCRIPTION OF THE SEVERAL VIEWS OF THE DRAWING

FIG. 6 is a diagram showing an example of a data structure.

FIG. 7 is a diagram showing another example of the input screen.

FIG. 8 is a diagram showing another example of the data structure.

DETAILED DESCRIPTION OF THE INVENTION

An analytical shell model forming apparatus according to an embodiment of the present invention will be described with reference to the accompanying drawing. In the description of this specification, an analytical shell model means a model having a defined analytical mesh, and configuration data before analytical mesh formation which data is used for forming the mesh is called a medial surface.

Figure 1:
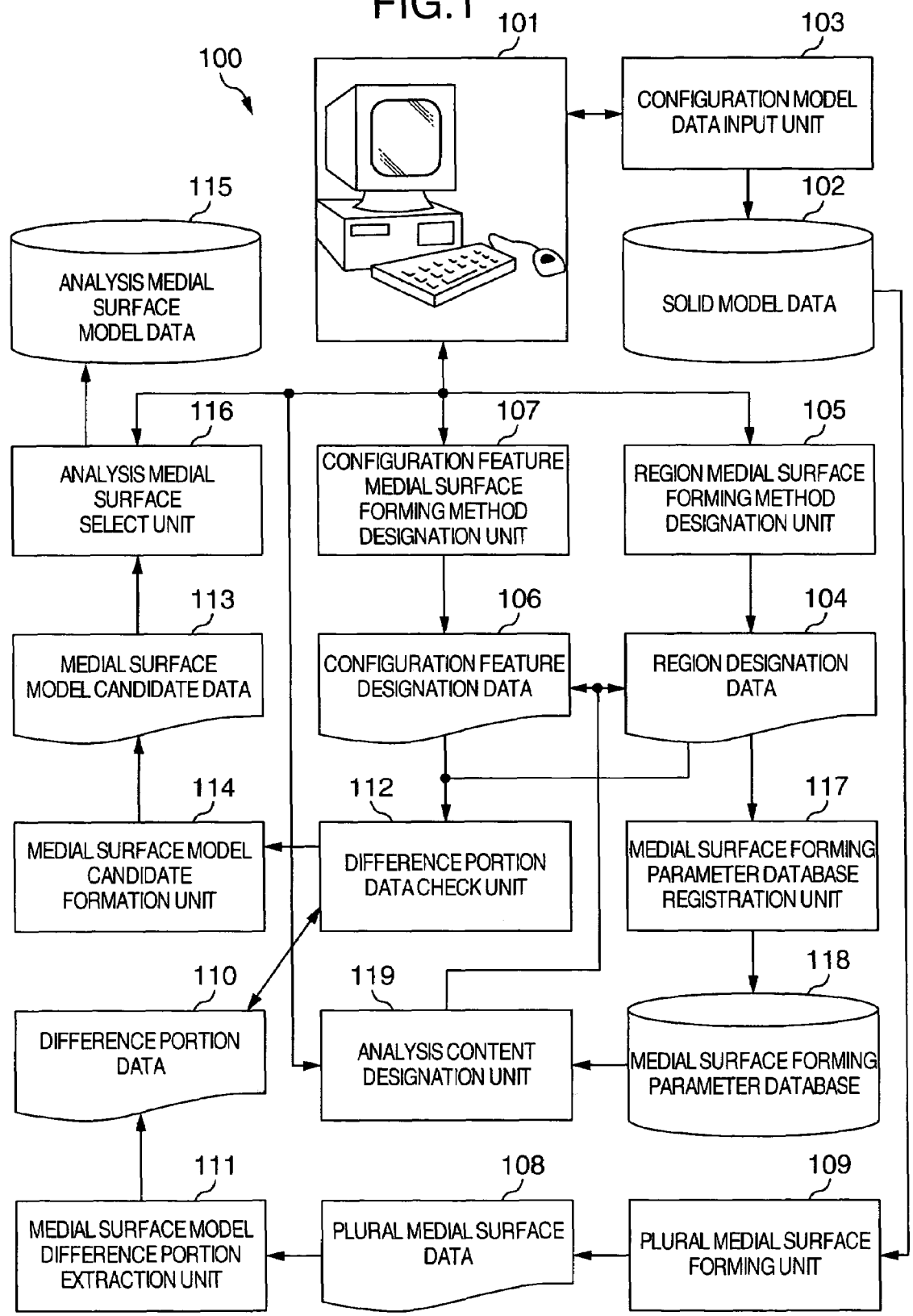
FIG. 1 is a block diagram showing an analytical shell model forming apparatus according to an embodiment of the present invention.

FIG. 1 is a diagram showing the system structure of an analytical shell model forming apparatus 100 according to an embodiment of the present invention. The analytical shell model forming apparatus 100 has an input/output unit 101 and a configuration model input unit 103. The input/output unit 101 has a keyboard, a pointing device and a display by which a user inputs and displays data. The configuration model input unit 103 registers an actual analysis target (solid model) having thickness as solid model data 102. The solid model input to the configuration model input unit 103 is divided into a plurality of regions, region coordinate values and a medial surface forming method are input to form a medial surface for each region, and the input values and method are registered in a region medial surface forming method designation unit 105 as region designation data 104.

Input to a configuration feature medial surface forming method designation unit 107 are a configuration feature type, a parameter and a medial surface forming method for designating the medial surface forming method for each parameter representing the configuration feature. These input data are registered as configuration feature designation data 106. A medial surface parameter database registration unit 118 registers the region designation data 104 and configuration feature designation data 106 in a medial surface forming parameter database 117 for each analysis content. An analysis content designation unit 119 selects an analysis content from the data registered in the medial surface forming parameter database 117, and resisters the corresponding region designation data and configuration feature designation data as the region designation data 104 and configuration feature designation data 106.

A plural medial surface forming unit 109 forms a plurality of medial surface models from the solid model data 102 by using a plurality of medial surface forming methods, and registers them as plural medial surface model data 108. A medial surface model difference extraction unit 111 extracts a difference portion from a medial surface model group registered in the plural medial surface model data 108, and registers it as difference portion data 110. A difference portion data check unit 112 compares the difference portion data 110 with the data registered in the region designation data 104 and configuration feature data 106, and registers only the coincident difference portion in the difference portion data 110. A medial surface model candidate formation unit 114 generates a medial surface model by combining the coincident difference portion and the difference portion data 110, and registers it as medial surface model data 113. An analysis medial surface model selection unit 116 selects a medial surface model to be used for analysis from the medial surface model candidate data 113, and registers it as analysis medial surface model 115. In this embodiment, a plurality of medial surface forming methods are implemented in the analytical shell model forming apparatus.

Figure 12:
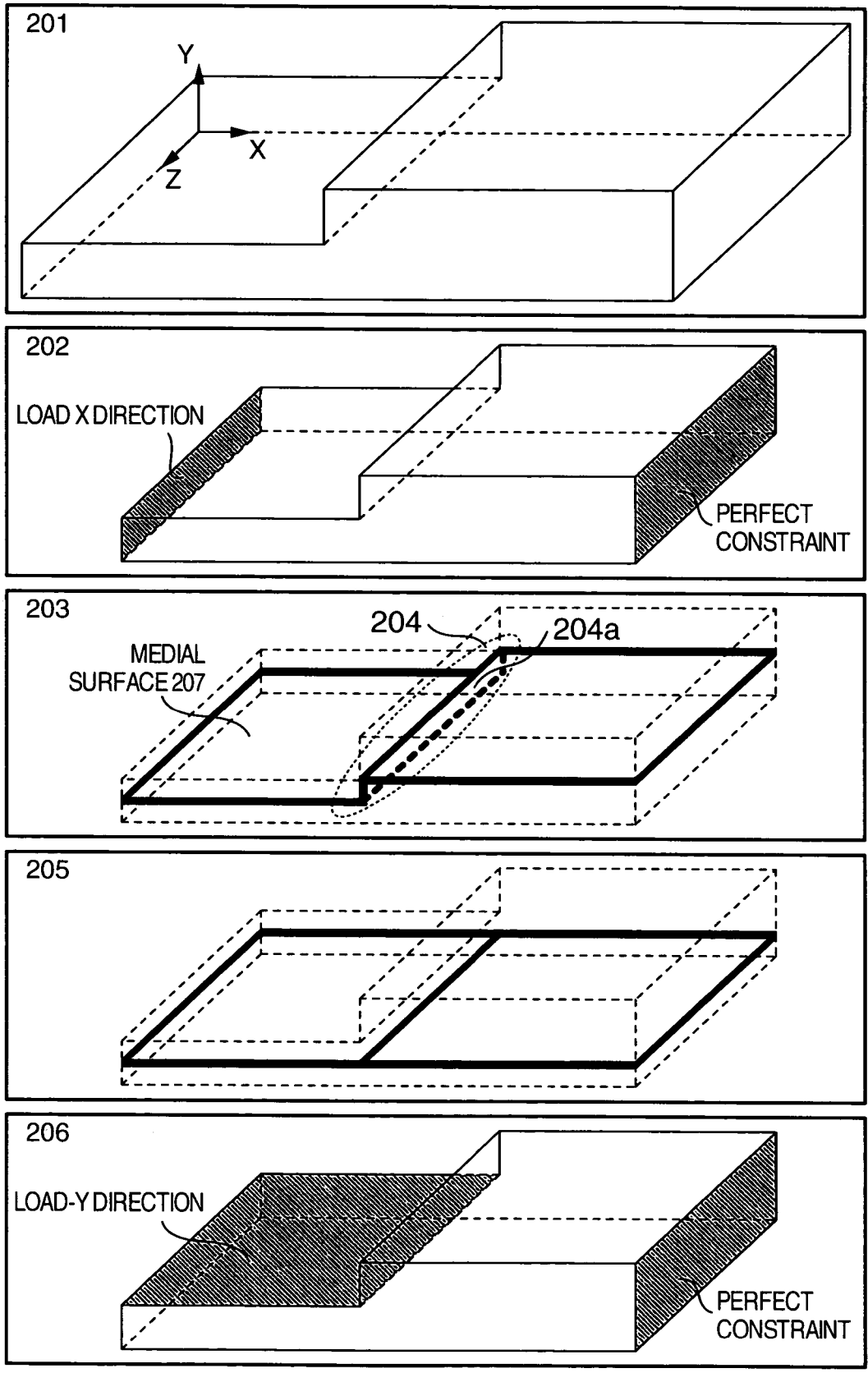
FIG. 12 is a diagram illustrating the relation among a medial surface model, boundary conditions and constraint conditions.

An analysis result is dependent upon the medial surface. As the boundary conditions and constraint conditions of a solid model 201 with steps shown in FIG. 12 are changed, an analysis precision and analysis time change greatly depending upon the configuration of the medial surface. For example, a medial surface model 203 having a medial surface 207 formed by connecting half points of a plate thickness of the solid model 201 is used as an analytical medial surface model. Under the conditions 202 that a load is applied to the solid model 201 from the left side along an X direction and the right side is perfectly constrained, a deformation different from an actual state appears at a fold portion 204 of the medial model 203 as the analysis model.

This is because a force applied to the medial surface 207 of the medial surface model 203 along the X direction is received by a flat surface 204a of the hold portion 204, although the solid model 201 has a force receiving surface (volume) up to the constraint surface. In order to solve this problem, a new medial surface model 205 without a step is formed. By using this medial surface model 205, an analysis precision under the boundary conditions and constraint conditions indicated by the conditions 202 can be improved.

However, as illustrated by the conditions 206, even if the right side perfect constraint condition is the same as the conditions 202, a bending moment action is different from that of the solid model 201 under the condition that a load is applied to the left upper surface along a vertical direction. Namely, although the bending moment actually acts upon an intermediate portion of the solid model 201 at which the plate thickness changes, the analysis result of the medial model 205 is that the bending moment does not act. Under the conditions 206 having such boundary and constraint conditions, the analysis precision can be improved by using the medial surface model 203. As above, the analysis precision can be improved by forming a medial surface in accordance with the analysis conditions and the like, in other words, by preparing a plurality of medial surfaces and selecting a proper one in accordance with the analysis conditions.

Figure 2:
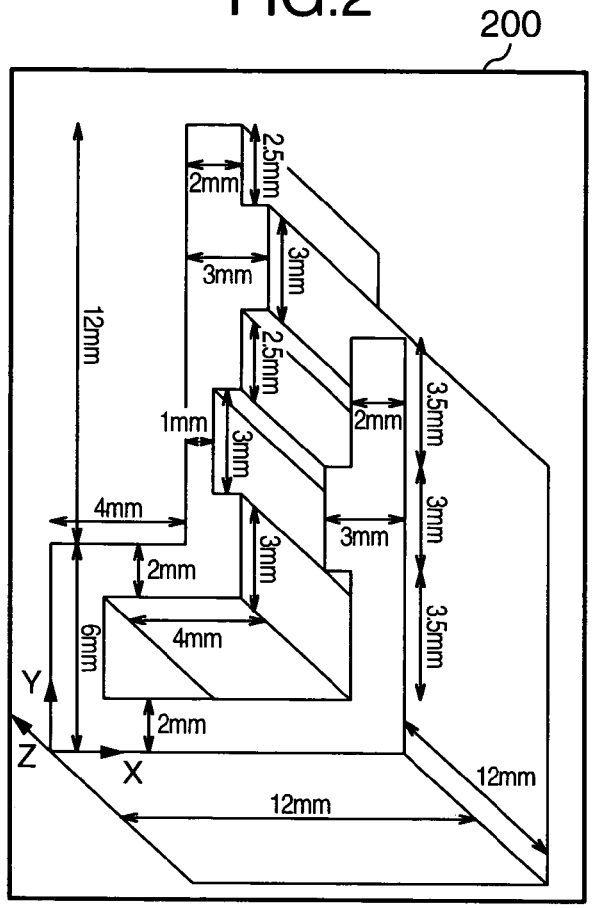
FIG. 2 is a perspective view of a solid model to which the present invention is applied.
Figure 3:
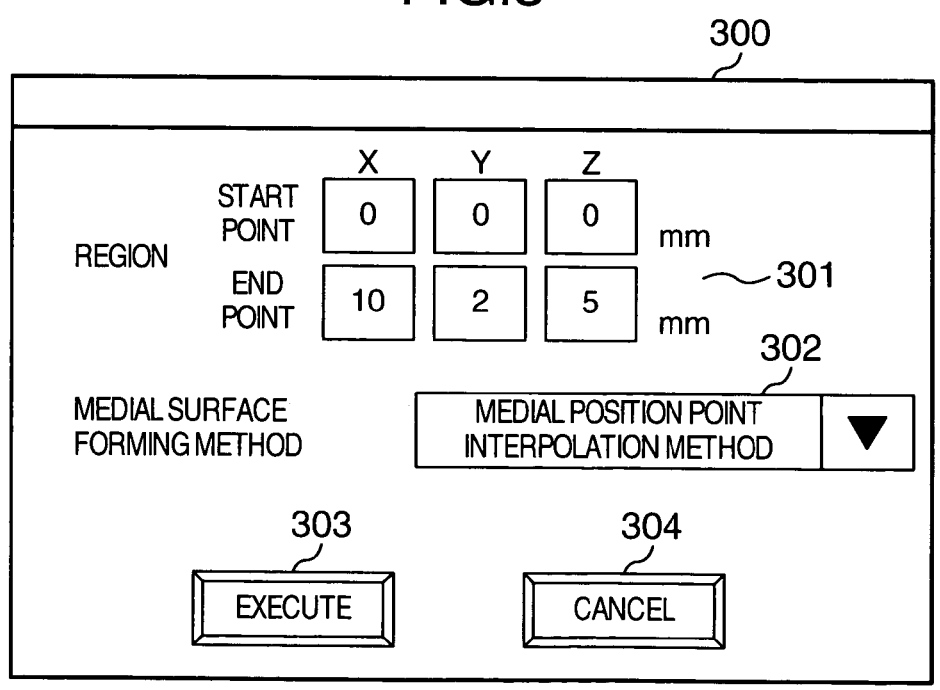
FIG. 3 is a diagram showing an example of an input screen.

Next, description will be made on a specific example of forming a medial surface from the solid model 200 shown in FIG. 2 by using the analytical shell model forming apparatus 100. FIG. 3 shows a display screen 300 of the input/output unit 101. A user inputs the coordinate values (X, Y, Z) of start and end points of a region to a region coordinate value designation field 301 on the operation screen. A medial surface forming method to be adopted, e.g., a "medial position point interpolation method", is input to a medial surface forming method designation field 302.

The user may enter directly the numerical values of the coordinate values or may designate them on a drawing by using a pointing device. A list of names of medial surface forming methods implemented in the analytical shell model forming apparatus 100 is displayed in the list format in the medial surface forming method designation field 302. The user selects a proper method from this list. As an execute button 303 is depressed, data input to the region coordinate value designation field 301 and medial surface forming method designation field 302 is registered in the region designation data 104. As a cancel button 304 is depressed, the designation of the region and medial surface forming method are released.

With reference to a display screen 400 shown in FIG. 4, description will be made on a method of inputting a configuration feature after data of the configuration model 201 is input. The user inputs a configuration feature type, e.g., "step", to a configuration feature type designation field 401 by using the input/output device 101. A configuration feature parameter, in this case, "5 mm", is input to a parameter designation field 402, and the medial surface forming method to be adopted, in this case, "medial position point interpolation method", is input to a medial surface forming method designation field 403.

The configuration feature type is a configuration feature type capable of recognized by the analytical shell model forming apparatus 100, and a list of configuration feature types is displayed in the list format. As an execute button 404 is depressed, data input to the feature type designation field 401, parameter designation field 402 and medial surface forming method designation field 403 is registered in the configuration feature designation data 106. As a cancel button 405 is depressed, the input data is released.

Figure 5:
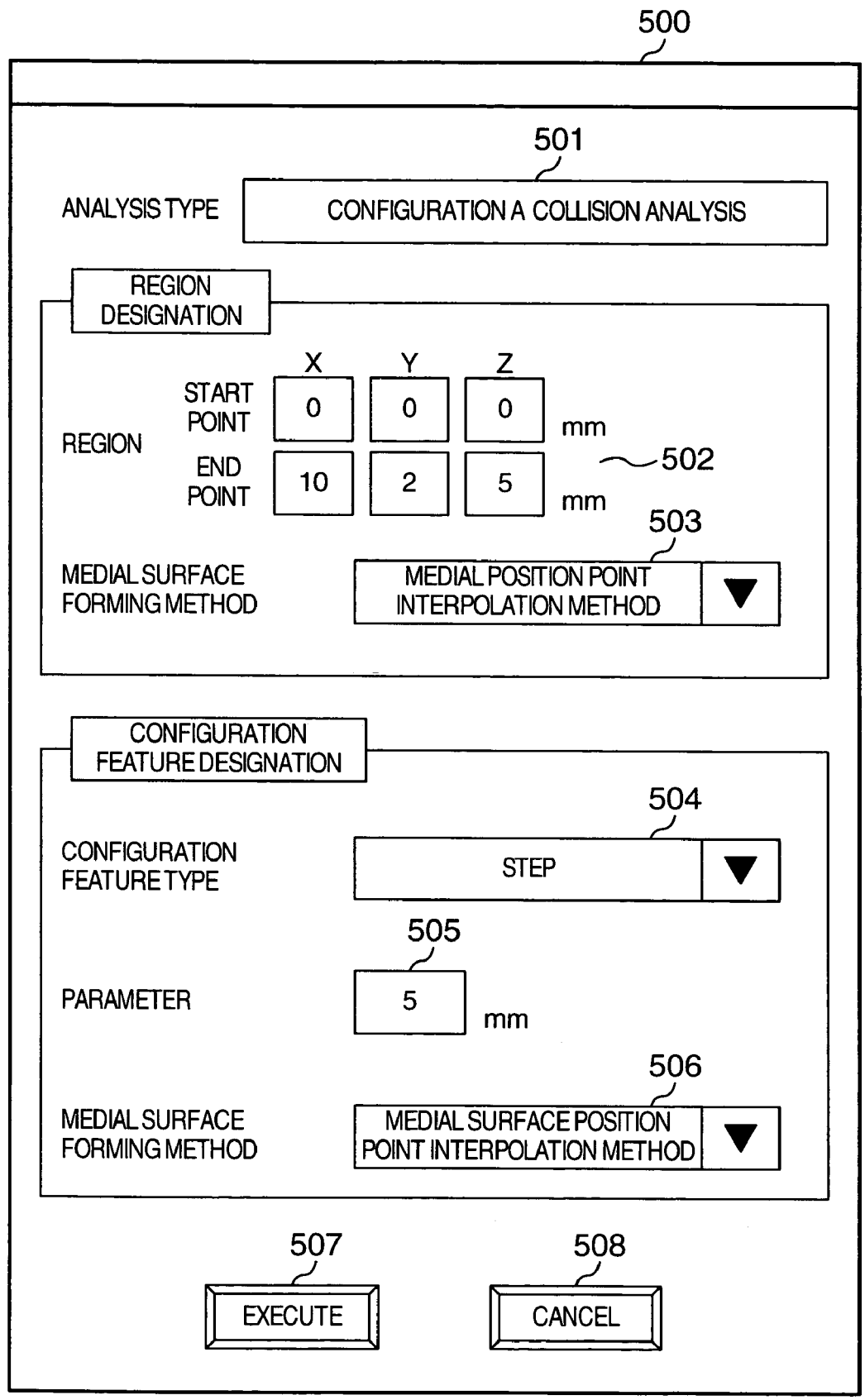
FIG. 5 is a diagram showing another example of the input screen.

Next, a medial surface forming parameter is registered in the database 118 for each region for which the medial surface is formed. By using the input/output unit 101, the user inputs an analysis type, in this case, "configuration A collision analysis" is input to an analysis type designation field 501 on a manipulation screen shown in FIG. 5.

The data input on the configuration feature medial surface forming screen 400 is used for the configuration feature type in the configuration feature type designation field 502, the configuration feature parameter in the parameter designation field 503 and the medial surface forming method in the medial surface forming method designation field 504. Similarly, the data input on the region medial surface forming screen 300 is used for the region coordinate values in the region coordinate value designation field 505 and the medial surface forming method in the medial surface forming method designation field 506. As an execute button 507 is depressed, the above-described input data is registered in the medial surface forming parameter database 117. As a cancel button 508 is depressed, the input data is released.

With the above-described procedure, data is stored in the medial surface parameter database 117 in the data structure shown in FIG. 6. The data in the analysis type designation field 501 on the display screen 500 is stored in an area 601, the data in the configuration feature type designation field 502 is stored in an area 602, the data in the parameter designation field 503 is stored in an area 603, the data in the medial surface forming method designation field 504 is stored in an area 604, the data in the region coordinate value designation field 505 is stored in an area 605, and the data in the medial surface forming method designation field 506 is stored in an area 606. A plurality set of the configuration feature designation data and region designation data can be registered for each analysis type.

After the data corresponding to each type of analysis is input, an actual analysis is prepared. First, the analysis type is determined. After the analysis type is determined, the analysis type is input to an analysis type designation field 701 on a display screen 700 for analysis preparation start. A list of the analysis type designation field 701 is already registered in the medial surface forming parameter database 117 so that the list is selected from a pull-down menu. After the preparation is completed, an execute button 702 is depressed. As the execute button 702 is depressed, the region designation data and configuration feature designation data corresponding to the selected analysis type are automatically selected and input as the region designation data 104 and configuration feature designation data 106. As a cancel button 703 is depressed the input data is released.

Figure 9A:
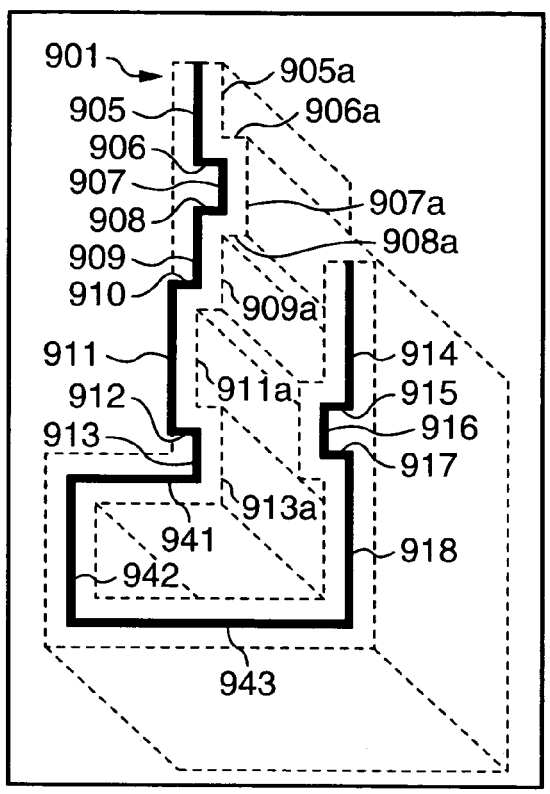
FIGS. 9A to 9C are a perspective view of a medial surface model.
Figure 9B:
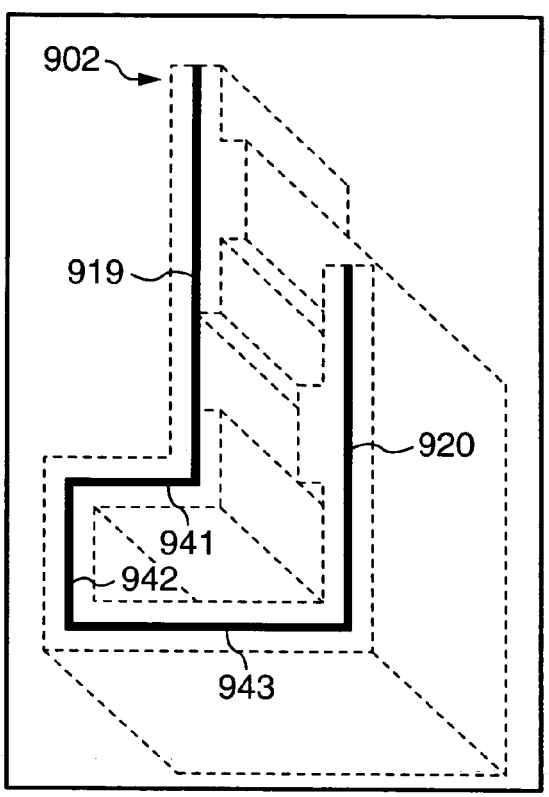
Figure 9C:
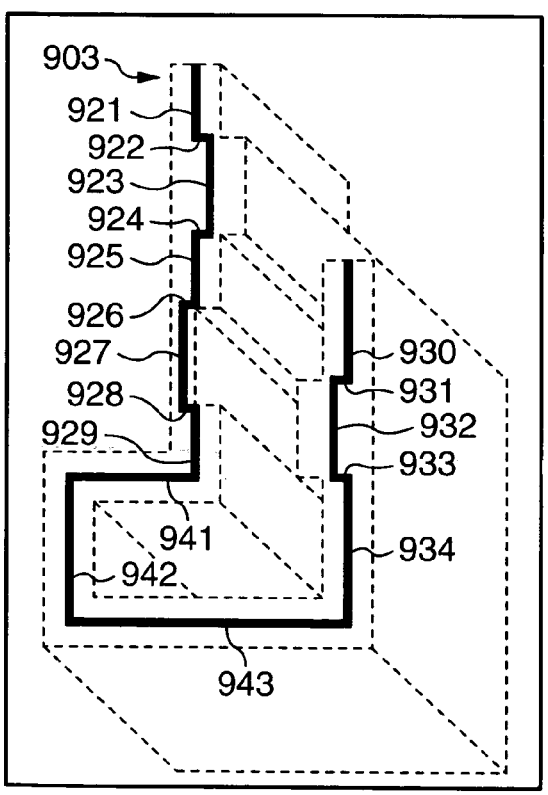

FIG. 8 shows a specific example of the data input to the medial surface forming parameter database 117. In this example, since "configuration A simple strength analysis", "configuration A detailed strength analysis", "configuration A collision analysis", "configuration B detailed strength analysis" and "configuration B collision analysis" have already been input as the data in the analysis type designation field 601, one of the analysis type is selected. As the "configuration A collision analysis" is selected, the following data is automatically registered in the region designation data and configuration feature designation data:

[Region designation data]
Region 1: (0.0, 0.0, 0.0)-(13.0, 25.0, 30.0)
Medial surface forming method 1: front side surface offset method
Region 2: (50.0, 0.0, 0.0)-(65.0, 25.0, 30.0)
Medial surface forming method 2: medial position point interpolation method
[Configuration feature designation data]
Configuration feature designation type 1: step
Parameter 1:5 mm
Medial surface forming method 1: front side surface offset method Since the analysis type, medial surface forming method and the like for each region are determined, a plurality of medial surface model data sets are generated from the solid model data 102 and registered in the plural medial surface model data 108. FIGS. 9A to 9C show several examples of the medial surface model obtained for the configuration model 201 shown in FIG. 2. FIG. 9A shows the medial surface model by a back side surface group offset method 901, FIG. 9B shows the medial surface model by a front side surface group offset method 902, and FIG. 9C shows the medial surface model by a medial position point interpolation method 903.

By the back side surface group offset method 901 shown in FIG. 9A, the solid model is divided into a plurality of thin plate portions in accordance with the back side (inner side) configuration of the solid model, and the back side surface constituting each thin plate portion of a thin plate portion group connecting the thin film portions is offset by a half of the distance corresponding to a representative plate thickness size. In this manner, the medial surface model for the thin plate portion group is formed.

More specifically, surfaces 905a, 907a, 909a, 911a and 913a constituting the back surface on the left side portion shown in FIG. 9A are moved to the left by a half of the representative size, in this example, by a half of the thickness of the upper end portion. Horizontal surfaces 906a, 908a and the like are also moved to the inner side of the solid model by a half of the representative size to form medial surfaces 906 and 908 along the horizontal direction. By repeating this procedure, medial surfaces 905, 907, 909, 911 and 913 in the vertical direction and medial surfaces 906, 908, 910 and 912 in the horizontal direction are formed. Lower medial surfaces 941 to 943 are not changed with the medial surface forming method in the case of the configuration of this embodiment. Similarly, medial surfaces 914 to 918 of the right side portion are formed by moving the inner side surface by a half of the representative size to the right.

Conversely, by the front side surface group offset method (FIG. 9B), the thin plate group is formed on the basis of the front side surface, and the front side surface is offset by a half of the representative plate thickness size toward the inner side to form medial surfaces 919, 920, and 941 to 943. By the medial position point interpolation method (FIG. 9C), medial surfaces 921 to 934 are formed by connecting points at a half of the thickness of the solid model having thickness. The generated medial surface model data 901 to 903 are registered in the plural medial model data 108.

It is checked whether the medial surface model data 901 to 903 registered in the plural medial surface model data 108 contains the medial surfaces having the same configuration. If not contained, the medial surfaces are registered in the difference portion data 110. For example, for the plural medial surface model data 901 to 903 shown in FIGS. 9A to 9C, the medial surfaces 905 to 934 are registered in the difference portion data 110.

The data of each medial surface input to the difference portion data 110 is compared with the region designation data 104. If the compared medial surface is in the region of the region designation data 104 and is formed by the method other than the designated medial surface forming method, then the compared medial surface data is removed from the difference portion data 110. Similarly, the data of each medial surface input to the difference portion data 110 is compared with the configuration feature designation data 106. If the compared medial surface has the configuration feature type and parameter in the configuration feature designation data 106 and is formed by the method other than the designated medial surface forming method, then the medial surface data is removed from the difference portion data 110.

Figures 4, 10:
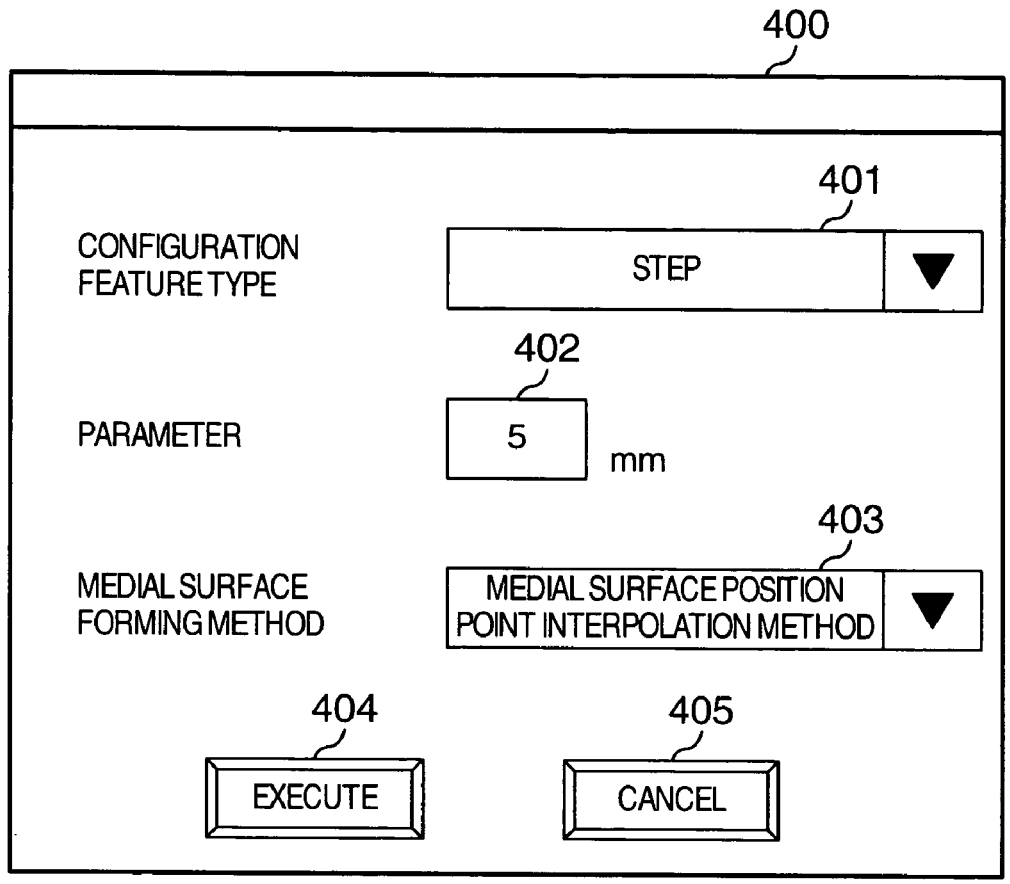
FIG. 4 is a diagram showing another example of the input screen.
FIG. 10 is a diagram showing another example of the data structure.

If the medial surfaces 905 to 934 and 941 to 943 of the medial surface model data 901 to 903 are registered in the difference portion data, if data 151 shown in FIG. 10 is registered in the region designation data, and if data 152 is registered in the configuration feature designation data, then the medial surfaces 905 to 913, 921 to 929, and 941 to 943 are removed from the difference portion. As a result, only the medial surfaces 914 to 920 and 930 to 934 are contained in the difference portion data.

Figure 11:
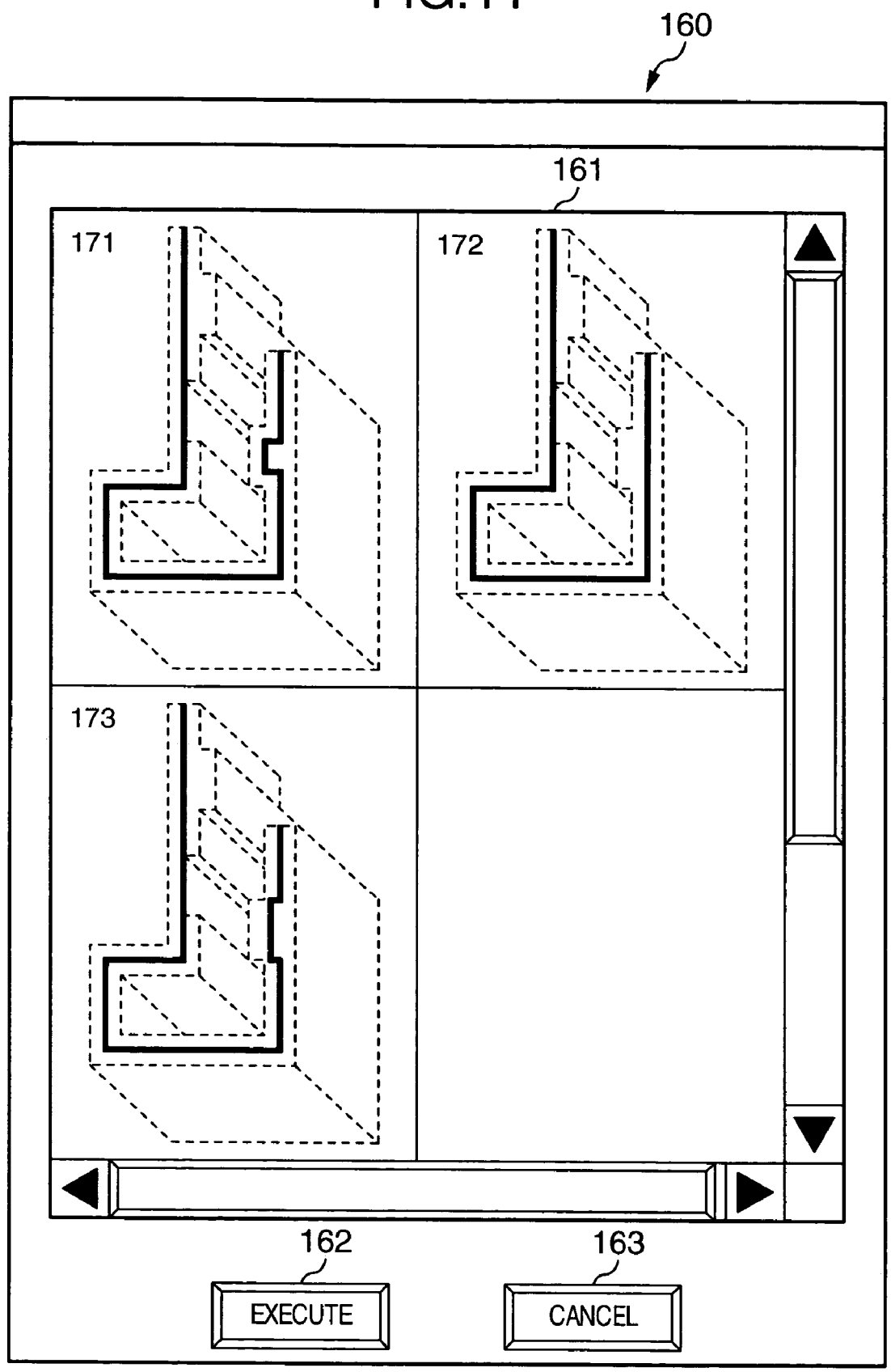
FIG. 11 is a diagram showing another example of the input screen.

Commonness of the medial surfaces 905 to 934 constituting each of the plural medial surface model data 901 to 903 is checked. The medial surface without commonness is registered in the difference portion data. It is therefore possible to form the medial surface model candidate data 113 by combining the remaining medial surface group and the medial surface group registered in the difference portion. FIG. 11 shows examples of formed medial surface model candidates 171 to 173.

FIG. 11 shows an example of a display screen 160 of the input/output unit 101. A user selects one medial surface model to be used for analysis from a plurality of medial surface model candidates 171 to 173 displayed in a candidate display field 161. In this case, the user selects a candidate from the medial surface model candidates 171 to 173 in accordance with the analysis type. As an execute button 162 is depressed, the selected medial surface model is registered in the analysis medial surface model data 115. As a cancel button 163 is depressed, the designation is released.

According to this embodiment, if a plate thickness is relatively thin and can be approximated by a shell model even if a solid model is complicated, a medial surface for analysis suitable for the boundary conditions and constraint conditions can be used and an analysis precision can be improved. Even if the boundary conditions and constraint conditions are changed, an analysis model can be changed easily.

According to the present invention, since the analytical shell model forming apparatus has a means for forming a plurality of medial surfaces, it is possible to use a medial surface suitable for analysis matching the analysis type and boundary conditions. It is therefore possible to shorten an analysis time and improve an analysis precision.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An analytical shell model forming apparatus for forming an analytical shell model for numerical analysis from a solid model to be analyzed, comprising:
a medial surface forming unit for forming a plurality of medial surfaces for a same portion of the solid model by using at least any one of a back side surface group offset method, a front side surface group offset method and a medial position point interpolation method;
an extracting unit for extracting a difference portion by comparing the plurality of formed medial surfaces for a same surface of the solid model;
a medial candidate model forming unit for forming a plurality of medial surface candidate models by using the extracted difference portion;
a display unit for displaying the formed medial surface candidate models;
a first selecting unit for selecting a medial surface model to be used for analysis from the plurality of formed medial surface candidate models; and
a first registering unit for registering the selected medial surface model as an analysis medial surface model.

2. The analytical shell model forming apparatus according to claim 1, further comprising:
a second selecting unit for selecting a medial surface automatic forming method to be applied to each of a plurality of regions divided from the solid model; and
a third selecting unit for selecting the medial surface automatic forming method to be applied to each parameter representative of a configuration feature,
wherein the display unit displays on the screen a medial surface candidate model having a medial surface formed by the methods selected by the second selecting unit or the third selecting unit.

3. The analytical shell model forming apparatus according to claim 1, further comprising:
a second registering unit for registering a medial surface automatic forming method to be selected in accordance with an analysis type and to be applied to each of a plurality of regions divided from the solid model and the medial surface automatic forming method to be applied to each parameter representative of a configuration feature, in a database as medial surface forming parameters.

4. The analytical shell model forming apparatus according to claim 3, wherein when the analysis type registered in the medial surface forming parameter database is selected, the second registering unit registers the medial surface automatic forming method to be applied to each region and the medial surface automatic forming method to be applied to each parameter representative of the configuration parameter, in the database as the medial surface forming parameters.

5. A method for forming an analytical shell model for numerical analysis from a solid model to be analyzed, comprising the steps of:

forming a plurality of medial surfaces for a same portion of the solid model by using at least any one of a back side surface group offset method, a front side surface group offset method and a medial position point interpolation method;

extracting a difference portion by comparing the plurality of formed medial surfaces for a same surface of the solid model;

forming a plurality of medial surface candidate models by using the extracted difference portion;

displaying the formed medial surface candidate models;

selecting a medial surface model to be used for analysis from the plurality of formed medial surface candidate models; and registering the selected medial surface model as an analysis medial surface model.

* * * * *